(12) United States Patent
Spirgi

(10) Patent No.: US 11,942,588 B2
(45) Date of Patent: Mar. 26, 2024

(54) ELECTRO-OPTICAL ASSEMBLY HAVING HEAT DISSIPATION, AND METHOD FOR PRODUCING SUCH AN ASSEMBLY

(71) Applicant: HARTING AG, Biel (CH)

(72) Inventor: Michael Spirgi, Belp (CH)

(73) Assignee: HARTING AG, Biel (CH)

( * ) Notice: Subject to any disclaimer, the term of this patent is extended or adjusted under 35 U.S.C. 154(b) by 457 days.

(21) Appl. No.: 17/296,272

(22) PCT Filed: Nov. 19, 2019

(86) PCT No.: PCT/EP2019/081813
§ 371 (c)(1),
(2) Date: May 24, 2021

(87) PCT Pub. No.: WO2020/109086
PCT Pub. Date: Jun. 4, 2020

(65) Prior Publication Data
US 2021/0320238 A1    Oct. 14, 2021

(30) Foreign Application Priority Data
Nov. 26, 2018  (DE) ...................... 10 2018 009 292.6

(51) Int. Cl.
*H01L 33/64* (2010.01)
*F21V 29/71* (2015.01)
*H01L 33/62* (2010.01)

(52) U.S. Cl.
CPC .......... *H01L 33/644* (2013.01); *F21V 29/713* (2015.01); *H01L 33/62* (2013.01); *H01L 2933/0066* (2013.01); *H01L 2933/0075* (2013.01)

(58) Field of Classification Search
CPC .................. H01L 33/644; H01L 33/62; H01L 2933/0066; H01L 2933/0075; H05K 3/0061; H05K 3/107; H05K 2201/10106; H05K 2201/10416; F21S 41/151; F21S 41/192; F21S 43/14; F21S 43/15
See application file for complete search history.

(56) References Cited

U.S. PATENT DOCUMENTS

| 6,504,107 | B1  | 1/2003  | Kragl |
| 2002/0011349 | A1 | 1/2002 | Kragl et al. |
| 2009/0296762 | A1* | 12/2009 | Yamaguchi .......... H04N 9/3129 359/197.1 |

(Continued)

FOREIGN PATENT DOCUMENTS

| CN | 1518850 A | 8/2004 |
| CN | 107642752 B | 11/2020 |

(Continued)

*Primary Examiner* — Marc Anthony Armand
(74) *Attorney, Agent, or Firm* — Smartpat PLC

(57) ABSTRACT

An assembly (1) comprises at least one base plate (2), a counter plate (3) connected thereto, and an electro-optical element (4). The base plate (2) is provided with at least one conductor track (7) for connecting the electro-optical element (4), and with at least one heat transfer element (5) for dissipating heat from the electro-optical element (4). The heat transfer element (5) is a heat-conductive operative connection between the electro-optical element (4) and the counter plate (3).

12 Claims, 4 Drawing Sheets

(56) References Cited

U.S. PATENT DOCUMENTS

| | | | |
|---|---|---|---|
| 2009/0315060 A1* | 12/2009 | Kim | H01L 33/642 257/98 |
| 2010/0033976 A1* | 2/2010 | Sun | F21V 29/83 362/382 |
| 2011/0019126 A1 | 1/2011 | Choi et al. | |
| 2013/0200411 A1 | 8/2013 | O'Brien et al. | |
| 2014/0293554 A1 | 10/2014 | Shashkov et al. | |
| 2017/0009976 A1 | 1/2017 | Hong et al. | |
| 2017/0066379 A1 | 3/2017 | Herrmann et al. | |
| 2017/0241618 A1 | 8/2017 | Badia | |
| 2017/0343204 A1 | 11/2017 | Ho | |
| 2018/0023779 A1 | 1/2018 | Seif et al. | |
| 2023/0086436 A1* | 3/2023 | Shiraishi | F21S 41/143 362/547 |

FOREIGN PATENT DOCUMENTS

| | | |
|---|---|---|
| CN | 107101179 B | 12/2021 |
| DE | 20302873 U1 | 7/2004 |
| DE | 102012100299 A1 | 7/2013 |
| DE | 102014223289 A1 | 5/2016 |
| EP | 1156708 A2 | 11/2001 |
| EP | 3116038 A1 | 1/2017 |
| EP | 3116038 B1 | 10/2019 |
| JP | 2013069547 A | 4/2013 |
| JP | 2016143603 A | 8/2016 |
| KR | 101671144 B1 | 11/2016 |
| KR | 20170124732 A | 11/2017 |
| TW | 200917582 A | 4/2009 |
| WO | 0028362 A1 | 5/2000 |
| WO | 03005784 A2 | 1/2003 |
| WO | 2011157515 A1 | 12/2011 |

* cited by examiner

ELECTRO-OPTICAL ASSEMBLY HAVING HEAT DISSIPATION, AND METHOD FOR PRODUCING SUCH AN ASSEMBLY

CROSS-REFERENCE TO RELATED APPLICATION

This application is a national stage application, filed under 35 U.S.C. § 371, of International Patent Application No. PCT/EP2019/081813, filed on Nov. 11, 2019, which claims the benefit of German Patent Application No. 10 2018 009 292.6, filed Nov. 26, 2018.

TECHNICAL FIELD

The disclosure relates to an electro-optical assembly and to a method for producing an electro-optical assembly.

Such an assembly may be used, for example, to orientate LEDs (light-emitting diodes), in particular high-power LEDs, individually in combination with MID (molded interconnect device) technology. MIDs may in this case be understood as molded parts having an integrated conductive track structure.

Such an assembly may also be used, for example, to take off or deliver external or internal signals or a current and/or voltage supply with releasable contacting in the case of a three-dimensionally injection-molded base plate or carrier plate (MID part).

BACKGROUND

In the prior art, document WO 00/28362 A1 discloses an electro-optical assembly and a method for producing such an assembly. Thus, it is known from said document to form a metal layer as a heat sink at the bottom of an indentation for receiving an electro-optical element, for example an LED, in a carrier plate.

The use of injection-molded carrier plates with a three-dimensional orientation (3D) of separate electro-optical components, such as for example LEDs, in particular high-power LEDs, is of ever-increasing importance. Such injection-molded carrier plates offer the advantage of complex 3D component geometries, which also fully integrate three-dimensional conductive track structures. For instance, conductive tracks on a plurality of component planes may be partially connected to one another. The application field of high-power LEDs in combination with MID technology for individual orientation of the separate LEDs is very broad. For example but without restriction, automobile headlamps and automobile tail lamps, exterior and interior lighting of all types, as well as camera lighting may be mentioned.

One essential point in the use of MID technology is the combination of mechanical and electrical functions in a component, the assembly outlay being reduced and the process sequence being shortened in this case by reducing the separate parts, which leads to a reduction of the manufacturing costs and a size reduction of the electronic assemblies.

As an alternative or in addition thereto, the base plate may be formed by means of so-called metal-plated frame implementation. In this case as well, the base plate is preferably produced in an injection-molding method. The method of metal-plated frame implementation is described in detail in document WO 2011/157515 A1.

In addition, functionally capable current feed-throughs may for example be produced by the electroplating of holes, which has not hitherto been possible with conventional laser structuring. Assemblies consisting of a plurality of components may often therefore be replaced with products that are obtained by a relatively simple and rapid two-stage manufacturing method, the manufacturing method being made up of injection molding and subsequent electroplating. In association with the configurational freedom in the component design, this method is often more economical compared with the previous production. For instance, high-end mechatronic systems for applications in automobile construction, in medical technology, in the field of telecommunications and electronics, which combine mechanical and electrical properties in a compact space, are obtained.

The use of high temperature-stable thermoplastics and the structurable metallization thereof is also conceivable, which allows new dimensions of base plates.

For MID components with plastic as the carrier material, the reliable removal of heat has hitherto been problematic, the heat being generated in particular by electro-optical components. The generated heat, which is produced in particular by using high-performance LEDs, leads to a distortion and long-term deformation of the plastic carrier plate, so that a long service life of the assembly cannot be ensured. The heat which is generated and not discharged may furthermore lead to the electro-optical component burning through and/or melting, and therefore only having a short-term functionality.

SUMMARY

The object of the disclosure is to provide a (design for an) assembly for at least one base plate, which avoids overheating so that the base plate and/or the electro-optical element remains as free as possible from heat and long-term destruction.

This object is achieved by the features as claimed.

An assembly consists of at least one base plate, a counter plate connected thereto and an electro-optical element. The base plate is provided with at least one conductive track for connecting the electro-optical element and with at least one heat transfer element for dissipating heat from the electro-optical element. The heat transfer element establishes a thermally conductive operative connection between the electro-optical element and the counter plate.

The advantages achieved with the invention are, in particular, that a very durable assembly may be produced by introducing the operative connection from the heat-producing region to a cooling region.

It is in this case particularly advantageous that more luminous intensity can be generated with the same electrical energy—or expressed another way, the same luminous intensity can be generated with less electrical energy—in the same installation space. In other words, the efficiency of the LEDs can be increased significantly by the heat removal according to the disclosure. This efficiency improvement may for example be a particularly great advantage for LED assemblies that have an autonomous electricity supply, for example using solar cells with an electrical energy storage unit.

Lastly, without the solution according to the disclosure, heating of the LED would lead to an inferior efficiency thereof. This would mean that a greater amount of electrical energy would be needed to generate the same luminous intensity. This would in turn entail even greater heating of the LED, and in the form of a chain reaction would thus both increase the energy consumption and significantly reduce the lifetime of the LED. Such a chain reaction, which is therefore extremely undesirable, is counteracted particularly advantageously.

A further advantage may be the production of a very economical insertable connection of a plug-in connector to a three-dimensionally injection-molded base plate (3D-MID).

According to one preferred configuration, the base plate is formed from a plastic material.

And in another preferred configuration, the base plate is an injection-molded component, in particular an MID component. And in one particularly preferred configuration, the injection-molded MID component is produced in a 2C (2-component) method and/or in an LDS (laser direct structuring) method.

The base plate may therefore be an injection-molded three-dimensional (3D) carrier plate consisting of at least one plastic constituent part. A carrier plate which is produced in an injection-molding method offers the advantage of complex 3D component geometries. In this case, it is likewise readily possible to integrate three-dimensional conductive track structures. More than one conductive track on more than one plane of the carrier plate may therefore be partially connected to one another. The relatively rapid, simple and very individual configurational possibility of such injection-molded components furthermore offers a solution for space problems. Bulky assemblies consisting of a plurality of components may often therefore be replaced with flexibly configurable compact products. Such a manufacturing method for an MID component is consequently flexibly and individually adaptable to respective geometrical requirements, for example requirements for conductive tracks or electro-optical elements.

An electro-optical element may for example be an LED lighting means, in particular a high-performance LED lighting means. Incandescent bulbs and other lighting means are, however, also included.

In one particularly preferred configuration, the counter plate is a heat sink. It is conceivable for the counter plate to be a housing plate and/or a housing wall, onto which the assembly is fastened. This is particularly advantageous since the assembly may also be applied afterward onto an already existing housing. It is then not necessary to provide a further counter plate in the assembly.

The counter plate may be a stamped part. For example, the counter plate may be a stamped sheet-metal part, in particular a sheet-metal part stamped in one piece. For example, the counter plate may be a stamped sheet-steel part, in particular a sheet-steel part stamped in one piece. Forming the counter plate from a ceramic material, for example, is not however excluded.

In one particularly preferred configuration, the counter plate is formed from a thermal conductor material, preferably a metal. A combination of different thermally conductive metals is also conceivable. It is furthermore conceivable to form the counter plate in all geometrically conceivable configurations. Depending on the requirement for the installation space and depending on the power of the electro-optical element, and therefore depending on the amount of heat produced, the counter plate may thus comprise a corresponding cooling surface and/or a corresponding cooling volume for heat absorption and/or for heat dissipation. In particular, the size of the cooling surface and/or the volume of the counter plate may be configured according to an amount of heat produced by an electro-optical element. Thus, it is expedient to provide a thermally conductive counter plate having a large surface area for rapid heat absorption and/or rapid heat dissipation for electro-optical elements having high power or high heat production.

In another advantageous configuration, the counter plate comprises cooling fins and/or cooling fingers and/or cooling pins. Such a configuration achieves a large cooling surface of the counter plate with a small overall size.

The heat transfer element dissipates heat produced at the electro-optical element and conducts the heat away to the counter plate. It is expedient for the heat transfer element to be a direct operative connection between the electro-optical element and the counter plate. It is advantageous to provide the heat transfer element directly on the heat-produced electro-optical element. In particular, it is expedient to connect the heat transfer element at least partially to the electro-optical element and/or to connect the heat transfer element at least partially to the counter plate. In this way, the amount of heat produced can be optimally transferred from the electro-optical element to the counter plate by means of the heat transfer element. The amount of heat generated can consequently be conducted away optimally from the plastic base plate by means of the heat transfer element. Even large amounts of heat, for example of high-performance LEDs, may be removed by means of the heat transfer element in such a way that the plastic base plate and/or the electro-optical element remains undamaged and is durable in terms of the function thereof.

According to one particularly preferred configuration, the heat transfer element is a metal insert, in particular a metal pin. It is expedient to form the heat transfer element as a thermally conductive material, in particular metal. A combination of different thermally conductive metals is also conceivable. In one expedient configuration, the metal pin is formed in the shape of a cuboid. A cuboid metal pin advantageously has in each case a large contact area for contacting the electro-optical element and for contacting the counter plate. In addition, the cuboid configuration of the metal pin has a shortest operative connection to the cooling counter plate. A cuboid pin is likewise easy to stamp in terms of its production.

In another configurational possibility, the heat transfer element is received in the base plate perpendicularly to a first base plate plane and perpendicularly to the opposite second base plate plane. Advantageously, a minimal length of the operative connection between the heat transfer element and the heat sink is provided in this way. The amount of heat produced is therefore also removed on the shortest path from the electro-optical element via the heat transfer element to the heat sink, and the base plate and/or the electro-optical element remain free from thermally induced damage.

In order to achieve a lower heat loss at junctions between the heat transfer element and the counter plate, it is conceivable to configure the heat transfer element and the counter plate in one piece. It is furthermore conceivable to form a cooling component configured in one piece in this way from the same material. For example, it is conceivable to provide a stamped metal sheet as the counter plate. It is expedient to bend at least one, preferably two and particularly preferably more than two heat transfer elements out from the stamped metal sheet. In this way, a counter plate configured in one piece with the heat transfer element is produced in a simple and economical way. The stamped metal sheet is, for example, a sheet stamped from brass.

In another preferred configuration, the base plate provides a receptacle for the heat transfer element. It is expedient to configure the receptacle for the heat transfer element in the form of a reception opening.

In one particularly preferred configuration, it is provided that the receptacle for the heat transfer element is a reception groove which extends from the electro-optical element to the counter plate, in particular is a reception groove extending perpendicularly to the first base plate plane and perpendicularly to the opposite second base plate plane. A reception groove extending perpendicularly to the respective counter plate plane has the advantage that the base plate has a shortest connection from the electro-optical element to the counter plate. Preferably, the reception groove is a cavity in the form of a cuboid. Such a configuration preferably allows form-fit reception of the metal pin likewise configured in the shape of a cuboid. The dissipation of the heat produced away from the base plate to the cooling counter plate is then optimally carried out by means of the heat transfer element.

It is advantageous for the receptacle to be a stamped receptacle. Stamping the receptacle from the counter plate produced in the injection-molding method has the advantage of a flexible configuration according to desired requirements.

A further configurational possibility may provide the introduction of a thermally conductive paste and/or a thermally conductive foil into the reception groove for the heat transfer element. The thermally conductive paste and/or thermally conductive foil are/is introduced into the reception groove in such a way that form-fit bonding of the heat transfer element in the reception groove is produced. Air inclusions and/or air gaps, which hinder heat removal, are prevented in this way. A phase-change material may, for example, be provided as a thermally conductive paste. It has been found that optimal heat removal is achieved in this way.

In one alternative particularly preferred configuration, it is provided that the receptacle for the heat transfer element is a reception groove with lateral offshoots, the reception groove with lateral offshoots extending from the electro-optical element to the counter plate, in particular being a reception groove with lateral offshoots which extends perpendicularly to the first base plate plane and perpendicularly to the opposite second base plate plane. It is advantageous for the reception groove with lateral offshoots to be integrated in an injection-molding method.

According to a first configuration, the heat transfer element is injected into the receptacle by means of overmolding in an injection-molding method. This has the advantage that the heat transfer element can be integrated in a base plate production process. The injected heat transfer element advantageously has an H shape so that a heat absorption surface for the heat absorption from the electro-optical element and/or a heat dissipation surface for heat dissipation onto the counter plate of the heat transfer element is maximized. Configuring the heat transfer element with an H shape furthermore has the advantage that an integrated conductive track for connecting the electro-optical element can be integrated onto and/or into lateral recesses of the heat transfer element. The free surface, which is formed between parallel-extending offshoots of the H-shaped heat transfer element, describes lateral recesses of the heat transfer element. This allows optimal surface utilization of the base plate, so that a minimally large assembly can be produced. It is, however, also conceivable to provide an I shape, an L shape, a T shape or another conceivable shape for the heat transfer element.

According to an alternative configuration, the heat transfer element is pressed into the receptacle. Such a production has the advantage that the heat transfer element may be mechanically installed afterward. Subsequent pressing of the heat transfer element into its receptacle is advantageous since it may be adapted to individual cooling conditions in relation to the configuration and/or material composition. It is likewise conceivable to press in a cooling component configured in one piece afterward, the cooling component being made up of the heat transfer element and the counter plate.

A method for producing an assembly consisting of a base plate and at least one electro-optical element, the base plate being provided with at least one conductive track for connecting the electro-optical element and with at least one heat transfer element for dissipating heat from the electro-optical element, contains the following steps:
  provision of the base plate, wherein the base plate is injection-molded from an LDS (laser direct structuring) material; and
    the heat transfer element is (likewise) overmolded in the injection-molding method of the base plate; or
    the heat transfer element is pressed in after the injection-molding method of the base plate;
  partial laser activation/laser radiation of the base plate so that a recess for a conductive track is formed;
  coating/metallization of the recess for the conductive track, a copper, nickel or gold coating is preferably used for the metallization;
  application of the electro-optical element.

The LDS-capable material from which the base plate is produced may in particular be a conventional plastic material, for example PBT (polybutylene terephthalate), to which an active material particle is added. The active material particle allows on the one hand absorption of radiation energy and conversion thereof into heat energy, and on the other hand a catalytic effect during the subsequent metallization. In this way, the desired conductive track structure may be produced in further steps. The method for the selective production of a conductive track structure is described in detail in document DE 10 2012 100 299 A1, the disclosure content of which is incorporated here by reference.

As an alternative or in addition, it is conceivable to admix the active material particle into a coating, for example a powder coating, intended for the base plate. In this case, a base plate formed from metal and/or an electrically conductive plastic base plate is used as the base plate. For example, steel and/or aluminum may be used as material for the metal base plate. The base plate may be produced by means of the metal-plated implementation method, which is described in detail in document WO 2011/157515 A1 and the disclosure content of which is incorporated here by reference.

BRIEF DESCRIPTION OF THE DRAWINGS

Various embodiments of the invention will be explained in more detail below with reference to FIGS. 1 to 5, in which.

DETAILED DESCRIPTION

The figures contain partially simplified, schematic representations. Identical reference signs are sometimes used for elements which are equivalent but possibly not identical. Different views of the same elements could be scaled differently.

Figure 1:
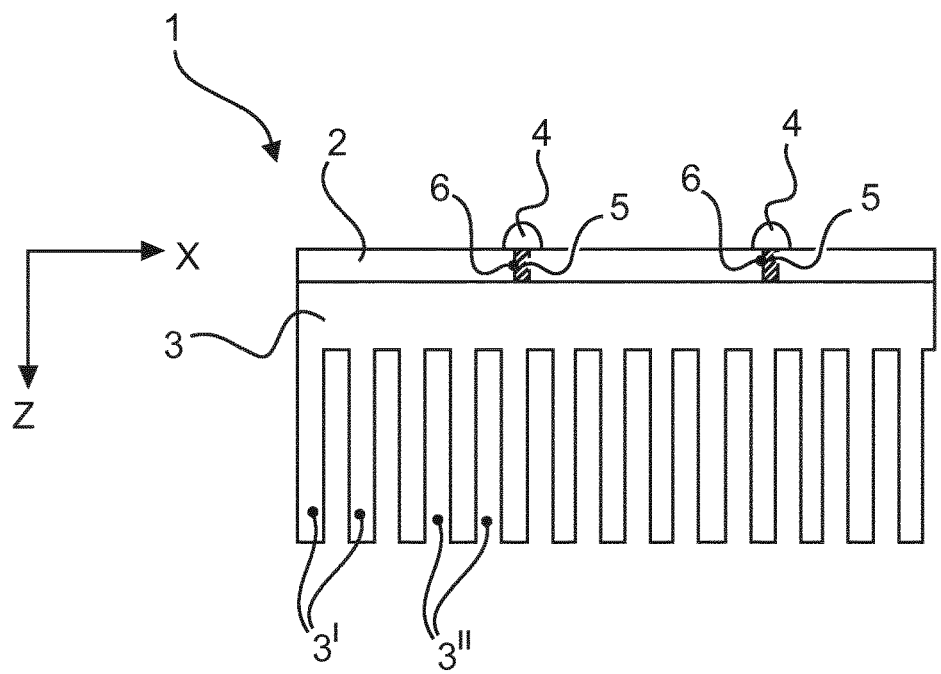
FIG. 1 shows a schematic sectional view of an assembly according to a first embodiment.

FIG. 1 schematically shows a sectional representation of an assembly 1, consisting of a base plate 2, a counter plate 3, three electro-optical elements 4 and respectively three heat transfer elements 5 for dissipating heat from the respective electro-optical element 4 to the counter plate 3.

In this embodiment, the base plate 2 is formed from LDS-capable material. In another embodiment, the base plate 2 may be formed from a powder-coated metal, the powder coating containing an LDS-capable additive.

In the present example, the electro-optical element 4 is configured as an LED, in particular as a high-performance LED. However, other embodiments which use further lighting means, such as incandescent bulbs, are hereby also disclosed.

The heat transfer element 5 is received in a reception groove 6 provided for the heat transfer element 5. The reception groove 6 is formed in the base plate 2. The reception groove 6 corresponds in its extent in the z direction to a thickness of the base plate 2, so that the reception groove 6 is a reception opening that extends from a first base plate plane (upper side of the base plate 2) to the opposite second base plate plane (lower side of the base plate 2).

The reception groove 6 corresponds in its extent in the x direction at least to a width of the electro-optical element, preferably to a smaller width and particularly preferably to one third of the width of the electro-optical element.

The reception groove 6 corresponds in its extent in the y direction at least to a width of the electro-optical element in the y direction, preferably to a larger width of the electro-optical element.

The heat transfer element 5 extends in its reception groove 6 perpendicularly from the electro-optical element 4 in the z direction to the counter plate 3. The heat transfer element 5 corresponds in its extent in the z direction at least to the thickness of the base plate 2, so that the heat transfer element 5 extends and/or passes through from the first base plate plane to the opposite second base plate plane.

In one exemplary embodiment, the heat transfer element may be a metal pin 5 formed from thermally conductive metal, in particular a metal pin 5 formed from brass.

The counter plate 3 shows cooling fins 3' in FIG. 1, the cooling fins comprising recesses 3". Cooling fins 3' formed in such a way have an increased surface area for optimized heat dissipation from the counter plate 3 into the surroundings. Such a configuration furthermore achieves a large cooling surface of the counter plate 3 with a small overall size. A heat flux is created in such a way that the heat produced at the electro-optical element is absorbed by means of the heat transfer element 5 and dissipated in the z direction onto the cooling counter plate 3. Heat buildup on a heat-sensitive plastic base plate 2 is thereby prevented and remains functionally capable for a long time.

Figure 2:
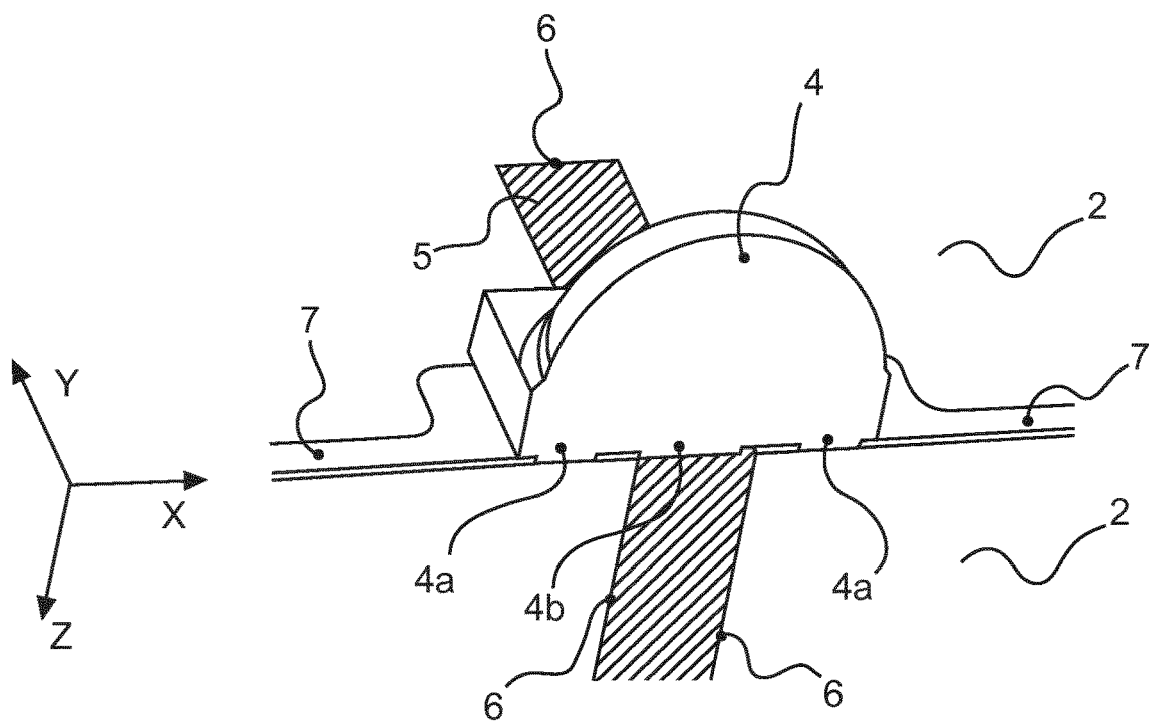
FIG. 2 shows a schematic sectional representation of a detail from the assembly.

FIG. 2 shows a schematic representation of a detail from the assembly 1, wherein the base plate 2, the electro-optical element 4, the heat transfer element 5, the receptacle 6 for the heat transfer element 5 and a conductive track 7 for connecting the electro-optical element 4 are shown.

On its side facing toward the base plate, the electro-optical element 4 according to FIG. 2 comprises at least one contact foot 4a for connecting to the conductive track 7 and at least one contact foot 4b for contacting the heat transfer element 5. Preferably, the at least one contact foot 4b of the electro-optical element 4 and the heat transfer element 5 are in direct contact. In test runs, direct contact between the electro-optical element 4 and the heat transfer element 5 has shown that the amount of heat produced can be dissipated directly to the heat transfer element 5. Consequently, the plastic base plate 2 remains free from accumulating heat and deformation is prevented.

The heat transfer element 5 in its reception groove 6 corresponds in its extent in the x direction at least to a width of the electro-optical element 4, preferably to a smaller width and particularly preferably at least to the width of the contact foot 4b of the electro-optical element 4.

The heat transfer element 5 in its reception groove 6 corresponds in its extent in the y direction at least to a width of the electro-optical element 4 in the y direction, preferably to a larger width of the electro-optical element. A heat transfer element protruding beyond the electro-optical element 4 in the y direction ensures that, in particular, high-performance LEDs can be used.

Figure 3:
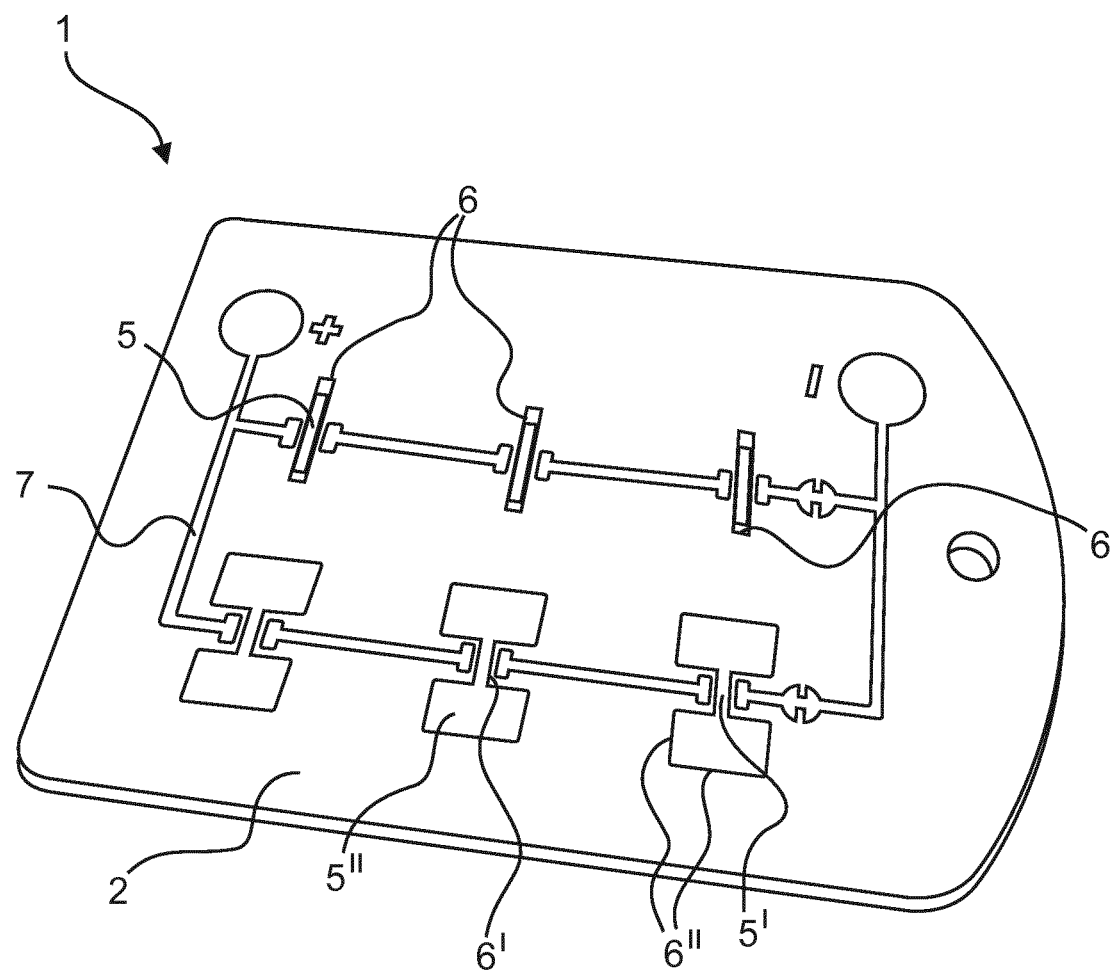
FIG. 3 shows a perspective view of the assembly according to a further embodiment.

FIG. 3 shows a perspective view of the assembly according to a further embodiment, consisting of the base plate 2, the heat transfer element 5 and a further heat transfer element 5', 5". The reception groove 6 for the heat transfer element 5 and a further reception groove 6' with laterally opposite offshoots 6" for the heat transfer element 5', 5" are furthermore represented.

According to FIG. 3, the heat transfer element 5 is a metal pin 5 pressed into its reception groove 6 after the injection-molding method. The reception groove 6 is a reception groove 6 stamped out likewise after the injection-molding method.

The heat transfer element 5', 5" is injected into its reception groove 6' with lateral offshoots 6" by means of over-molding in an injection-molding method. According to FIG. 3, an H-shaped configuration is produced for the heat transfer element, its branches 5" orientated parallel to one another having a substantially larger heat absorption surface in comparison with its connecting pin 5' for the branches 5" orientated parallel to one another. The comparatively thin connecting pin 5' is preferably provided for contacting with the electro-optical element 4, and the connecting pin 5' is particularly preferably provided for contacting the contact foot 4b of the electro-optical element 4. The heat, absorbed at the connecting pin 5', from the electro-optical element 4 is removed via the connecting pin 5' on the one hand to its terminally connected branches 5" orientated parallel to one another and removed on the other hand directly to the cooling counter plate 3.

Providing an H-shaped heat absorption surface on the heat transfer element 5', 5" offers the advantage that a large contact area is produced for rapid and reliable absorption and subsequent removal of the heat from the electro-optical element 4 to the cooling counter plate 3. The H-shaped configuration of the heat transfer element 5', 5" extends from a connecting plane for the electro-optical element 4 of the base plate 2 to the opposite connecting plane for connecting to the counter plate plane of the base plate 2. An H-shaped heat delivery surface to the counter plate 3 is consequently provided on the heat transfer element 5', 5".

Figure 4:
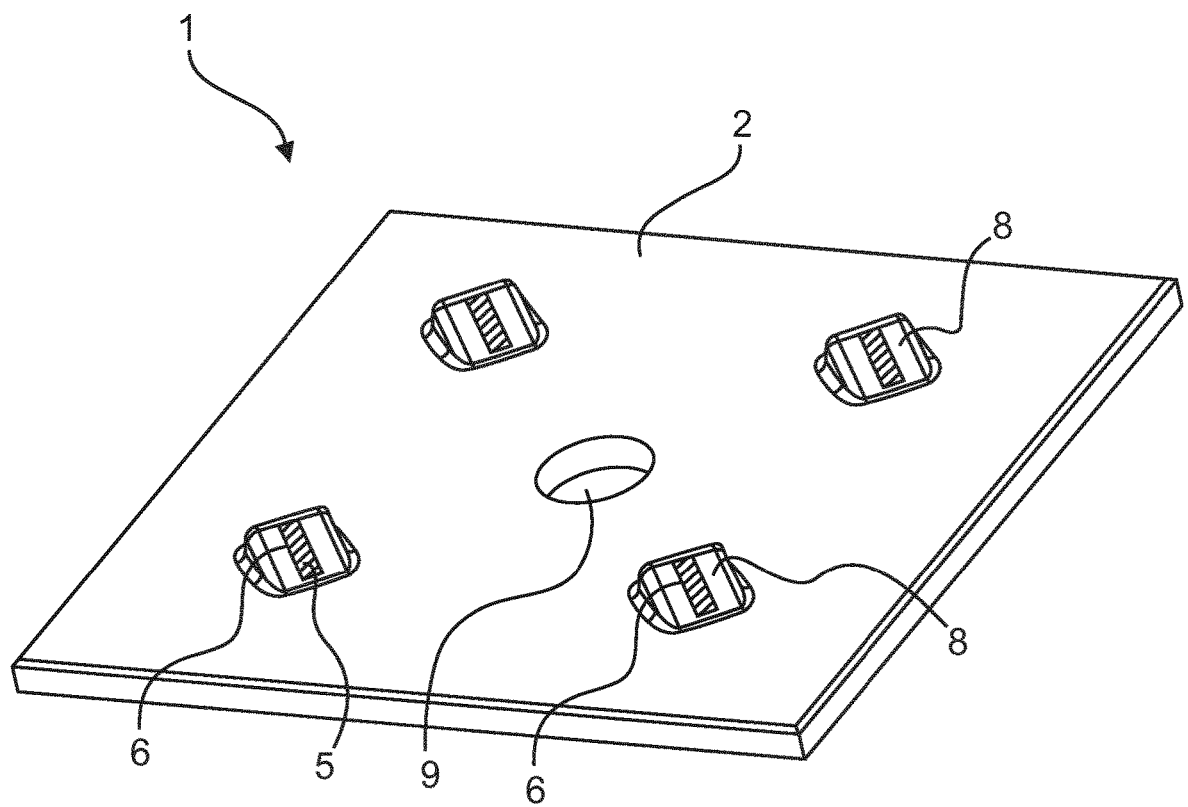
FIG. 4 shows a perspective view from above of the assembly according to a further embodiment.

FIG. 4 shows an assembly with the base plate 2 and the heat transfer element 5, the heat transfer element 5 being configured as a metal pin 5, and the conductive tracks 7 not being explicitly represented. Furthermore, at least one elevation 8, preferably two to four elevations and particularly preferably 64 to 128 elevations on a base plate 2, is provided for applying an electro-optical element 4. In particular, the elevations 8 on the base plate 2 are orientated at an inclined angle with respect to the first base plate plane. The first base plate plane is precisely the plane which is represented visibly in FIG. 4. The inclined elevations 8 and the base plate 2 are configured in one piece. Preferably, the elevations 8 are molded in the injection-molding method for producing the base plate 2. The inclination of the elevations 8 is used for orientation of the electro-optical element 4, so that variable inclination angles for the elevations 8 may be provided depending on the requirement for the orientation of the light beam of the electro-optical element 4.

Preferably, the inclination angle of the elevations 8 for orientating the electro-optical elements 4, measured at the first base plate plane, is 45°, particularly preferably less than 45°, measured from the first base plate plane.

One reception groove 6 respectively for respectively one heat transfer element 5 is provided in the base plate 2. The respectively one reception groove 6 is advantageously a stamped reception groove 6. The reception groove 6 extends from respectively one elevation 8 of the base plate 2 of the first base plate plane to the opposite-lying second base plate plane. The respective heat transfer element 5 is received in its reception groove 6 and correspondingly extends into the elevation 8. In this way, the heat-removing heat transfer element 5 is provided precisely at the connection region of the electro-optical element 4.

In particular, a first end of the heat transfer element 5 is orientated with an inclination, specifically in a manner corresponding to the inclination angle of the elevation 8 on the first base plate plane, and a second end is configured extending parallel to the opposite second base plate plane. The first end of the heat transfer element 5 thus terminates in a form-fit with the inclined surface of the elevation 8, and the second end of the heat transfer element 5 terminates in a form-fit with the surface of the opposite-lying second base plate plane (cf. FIG. 4, FIG. 5).

Figure 5:
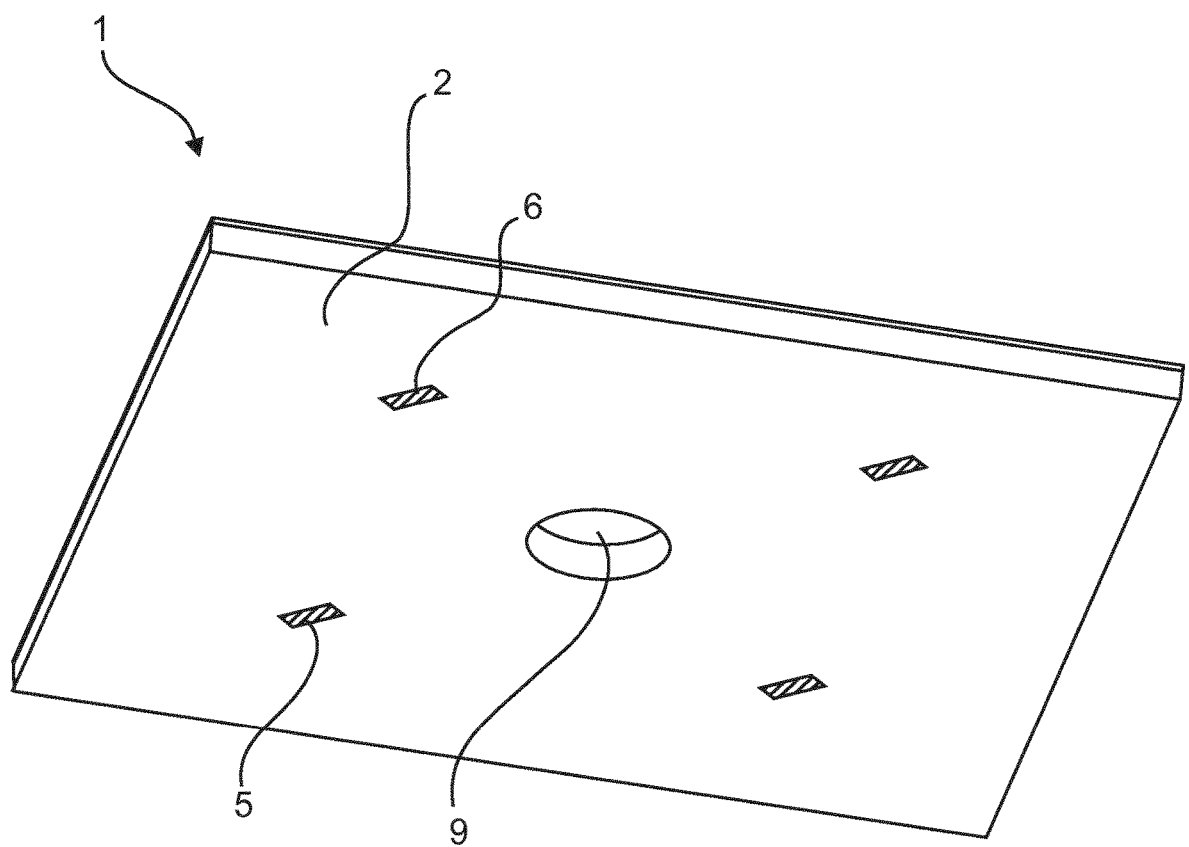
FIG. 5 shows a perspective view from below of the assembly according to the embodiment of FIG. 4.

According to FIG. 4 and FIG. 5, the heat transfer element 5 is a stamped metal pin 5. The metal pin 5 then extends from the inclined elevation 8 of the base plate plane on the one hand to the opposite base plate plane on the other hand. Furthermore, the metal pin 5 is orientated perpendicularly to the first base plate plane and perpendicularly to the opposite-lying base plate plane.

A fastening opening 9, as represented in FIG. 4, is used to apply the assembly at a desired position. The present exemplary embodiment provides that the assembly is applied on a fixing rod. The fixing rod is preferably formed from a thermally conductive material, so that the fixing rod is used as a heat sink. The heat produced at the electro-optical element 4 can then be removed onto the fixing rod and a further counter plate 3 does not need to be provided.

Preferably, the base plate 2 is a base plate 2 formed from metal, so that the heat can be absorbed by means of the heat transfer element 5 and removed via the metal base plate 2 onto the cooling fixing rod (not represented). Furthermore preferably, a thermally conductive paste and/or thermally conductive foil (not represented) is provided at the junction from the metal base plate 2 to the fixing rod. Particularly preferably, the thermally conductive paste and/or thermally conductive foil fully fills air inclusions so as to allow form-fit fixing of the base plate 2 on the fixing rod. The form-fit fixing has the advantage that efficient heat removal onto the cooling fixing rod is achieved.

It is thus clear that the assembly 1 can be adapted economically to different geometrical requirements. If a cooling fastening possibility exists at the desired application position of the assembly, for example, it is expedient to omit a base plate 2.

FIG. 5 shows a perspective view of the assembly 1 represented in FIG. 4 from below, wherein the base plate 2, the at least one heat transfer element 5 and the fastening opening 9 for fastening the assembly 1 on a fixing rod (not represented) are shown. The base plate 2 represented in FIG. 5 shows the second base plate plane lying opposite the first base plate plane.

Numerous further exemplary embodiments are possible, for example the following:

Embodiment 1: An assembly consisting of at least one base plate, a counter plate connected thereto and an electro-optical element, the base plate being provided with at least one conductive track for connecting the electro-optical element and with at least one heat transfer element for dissipating heat from the electro-optical element, characterized in that the heat transfer element is a thermally conductive operative connection between the electro-optical element and the counter plate.

Embodiment 2: The assembly according to embodiment 1, characterized in that the base plate is formed from a plastic material.

Embodiment 3: The assembly according to either of the preceding embodiments, characterized in that the base plate is an injection-molded component, in particular an MID (Molded Interconnect Device) component.

Embodiment 4: The assembly according to embodiment 3, characterized in that the injection-molded MID component is produced in particular in the 2C (2-component) method and/or in the LDS (laser direct structuring) method.

Embodiment 5: The assembly according to one of the preceding embodiments, characterized in that the counter plate is a heat sink.

Embodiment 6: The assembly according to one of the preceding embodiments, characterized in that the counter plate is formed from a thermal conductor material, preferably a metal.

Embodiment 7: The assembly according to one of the preceding embodiments, characterized in that the heat transfer element is a metal insert, in particular a metal pin.

Embodiment 8: The assembly according to one of the preceding embodiments, characterized in that the base plate provides a receptacle for the heat transfer element.

Embodiment 9: The assembly according to embodiment 8, characterized in that the receptacle for the heat transfer element is a reception groove which extends from the electro-optical element to the counter plate, in particular is a reception groove extending perpendicularly to a base plate plane.

Embodiment 10: The assembly according to embodiment 9, characterized in that the heat transfer element is injected into the receptacle by means of overmolding in an injection-molding method.

Embodiment 11: The assembly according to embodiment 9, characterized in that the heat transfer element is pressed into the receptacle.

Embodiment 12: A method for producing this assembly according to embodiments 1 to 11, or another assembly consisting of at least one base plate and at least one electro-optical element, the base plate being provided with at least one conductive track for connecting the electro-optical element and with at least one heat transfer element for dissipating heat from the electro-optical element, containing the following steps:

provision of the base plate, wherein the base plate is injection-molded from an LDS (Laser Direct Structuring) material; and the heat transfer element is overmolded in the injection-molding method of the base plate; or the heat transfer element is pressed in after the injection-molding method of the base plate;

partial laser activation/laser radiation of the base plate so that a recess for a conductive track is formed;

coating/metallization of the recess for the conductive track, a copper, nickel or gold coating is preferably used for the metallization;

application of the electro-optical element.

Even though various aspects or features of the invention are respectively shown in the figures in combination, it is clear to a person skilled in the art—unless otherwise indicated—that the combinations represented and discussed are not the only possible ones. In particular, mutually corresponding units or feature complexes from different exemplary embodiments may be replaced with one another.

LIST OF REFERENCE SIGNS 1 assembly
2 MID component, base plate
3 metal part, counter plate
3' cooling fins
3" recesses
4 electro-optical element
4a contact foot for connecting to conductive track 7
4b contact foot for contacting the heat transfer element 5
5 heat transfer element or metal pin
5' connecting pin
5" branches orientated parallel to one another
6 reception groove
7 conductive track
8 elevations on base plate 2
9 fastening opening

The invention claimed is:

1. An assembly (1), comprising:
   at least one injection-molded MID (Molded Interconnect Device) component (2) having an upper side and a lower side;
   a metal part (3) connected to the lower side of the MID component (2); and
   an electro-optical element (4) arranged on the upper side of the MID component (2),
   the MID component (2) being provided
      with at least one conductive track (7) for connecting the electro-optical element (4) and
      with a heat transfer element (5) for dissipating heat from the electro-optical element (4),
   wherein the heat transfer element (5) is a thermally conductive operative connection between the electro-optical element (4) and the metal part (3) arranged in a receptacle (6) that extends through the MID component (2) from the electro-optical element (4) at the upper side to the metal part (3) at the lower side.

2. The assembly (1) as claimed in claim 1, wherein the MID component (2) is formed from a plastic material.

3. The assembly (1) as claimed in claim 1, wherein the injection-molded MID component is produced in a 2C (2-component) method and/or in a LDS (laser direct structuring) method.

4. The assembly (1) as claimed in claim 1, wherein the metal part (3) is a heat sink (3).

5. The assembly (1) as claimed in claim 1, wherein the metal part (3) is formed from a thermal conductor material.

6. The assembly (1) as claimed in claim 1, wherein the heat transfer element (5) is a metal insert that extends through the receptacle (6), and wherein the heat transfer element (5) directly contacts a contact foot of the electro-optical element (4).

7. The assembly (1) as claimed in claim 1, wherein the heat transfer element (5) is a metal pin (5) having a height that corresponds to at least a thickness of the MID component (2).

8. The assembly (1) as claimed in claim 1, wherein the injection-molded MID component is a base plate (2) having a base plate plane, and wherein the metal part is a counter plate (3).

9. The assembly (1) as claimed in claim 8, wherein the receptacle (6) for the heat transfer element (5) is a reception groove (6) extending perpendicularly to a base plate plane.

10. The assembly (1) as claimed in claim 8, wherein the heat transfer element (5) is injected into the receptacle (6) by overmolding in an injection-molding method.

11. The assembly (1) as claimed in claim 8, wherein the heat transfer element (5) is pressed into the receptacle (6).

12. A method for producing the assembly (1) as in claim 1, comprising:
   injection-molding the MID component (2) from an LDS (Laser Direct Structuring) material;
   overmolding the heat transfer element (5) during the injection-molding of the MID component (2) or pressing the heat transfer element (5) in after the injection-molding of the MID component (2);
   forming a recess for a conductive track (7) in the MID component (2) by partial laser activation/laser radiation;
   coating or metallizing the recess for the conductive track (7);
   applying the electro-optical element (4) on the MID component.

* * * * *